United States Patent
Huang

(10) Patent No.: US 12,543,416 B2
(45) Date of Patent: Feb. 3, 2026

(54) METHOD FOR IMPROVING TRANSVERSE MAGNETIC (TM) MODE LIGHT EXTRACTION EFFICIENCY OF ULTRAVIOLET ALINGAN LIGHT-EMITTING DIODE

(71) Applicant: ZHIXIN SEMICONDUCTOR (HANGZHOU) CO., LTD, Zhejiang (CN)

(72) Inventor: Xiaohui Huang, Hangzhou (CN)

(73) Assignee: ZHIXIN SEMICONDUCTOR (HANGZHOU) CO., LTD, Zhejiang (CN)

( * ) Notice: Subject to any disclaimer, the term of this patent is extended or adjusted under 35 U.S.C. 154(b) by 435 days.

(21) Appl. No.: 18/035,099

(22) PCT Filed: Dec. 20, 2021

(86) PCT No.: PCT/CN2021/139683
§ 371 (c)(1),
(2) Date: May 2, 2023

(87) PCT Pub. No.: WO2022/135344
PCT Pub. Date: Jun. 30, 2022

(65) Prior Publication Data
US 2024/0387780 A1    Nov. 21, 2024

(30) Foreign Application Priority Data
Dec. 25, 2020 (CN) .......................... 202011558402.5

(51) Int. Cl.
*H10H 20/841* (2025.01)
*H10H 20/01* (2025.01)
(Continued)

(52) U.S. Cl.
CPC .... *H10H 20/841* (2025.01); *H10H 20/01335* (2025.01); *H10H 20/812* (2025.01); *H10H 20/8252* (2025.01); *H10H 20/034* (2025.01)

(58) Field of Classification Search
CPC .......... H10H 20/841; H10H 20/01335; H10H 20/812; H10H 20/8252; H10H 20/034; H10H 20/819
See application file for complete search history.

(56) References Cited

U.S. PATENT DOCUMENTS

2019/0051790 A1    2/2019    Horng et al.
2020/0075809 A1    3/2020    Rajan et al.

FOREIGN PATENT DOCUMENTS

| CN | 105679910 A | 6/2016 |
| CN | 108493311 A | 9/2018 |

(Continued)

OTHER PUBLICATIONS

International Search Report and Written Opinion dated Mar. 23, 2022, in related International Appl. No. PCT/CN2021/139683, 11 pages.

*Primary Examiner* — Samuel A Gebremariam
(74) *Attorney, Agent, or Firm* — JEEN IP LAW, LLC

(57) ABSTRACT

Disclosed is a method for improving transverse magnetic (TM) mode light extraction efficiency of an ultraviolet AlInGaN light-emitting diode. As the Al content in the AlInGaN light-emitting diode increases, the wavelength decreases gradually. Meanwhile, light extraction dominated by a TE mode is switched to light extraction dominated by a TM mode. To improve the light extraction efficiency of the TM mode, in the present disclosure, a passivation layer is first grown in an etched N-type electrode region and an edge electrode region, and then a reflective metal region of an inverted trapezoidal structure is etched in the region of the passivation layer. Metal with high reflectivity for ultraviolet (Continued)

light is evaporated in the region of the inverted trapezoidal structure, and TM light generated in a quantum well can be reflected to the external through a metal layer with high reflectivity, which improves the TM mode light extraction efficiency.

18 Claims, 5 Drawing Sheets

(51) Int. Cl.
*H10H 20/812* (2025.01)
*H10H 20/825* (2025.01)

(56) References Cited

FOREIGN PATENT DOCUMENTS

| | | |
|---|---|---|
| CN | 108807612 A | 11/2018 |
| CN | 112713227 A | 4/2021 |
| CN | 213988913 U | 8/2021 |

METHOD FOR IMPROVING TRANSVERSE MAGNETIC (TM) MODE LIGHT EXTRACTION EFFICIENCY OF ULTRAVIOLET ALINGAN LIGHT-EMITTING DIODE

CROSS REFERENCE TO RELATED APPLICATION

The present disclosure is a national stage application of International Patent Application No. PCT/CN2021/139683, filed on Dec. 20, 2021, which claims priority to the Chinese Patent Application No. 202011558402.5, filed with the China National Intellectual Property Administration (CNIPA) on Dec. 25, 2020, and entitled "METHOD FOR IMPROVING TRANSVERSE MAGNETIC (TM) MODE LIGHT EXTRACTION EFFICIENCY OF ULTRAVIOLET ALINGAN LIGHT-EMITTING DIODE", which is incorporated herein by reference in its entirety.

TECHNICAL FIELD

The present disclosure relates to a method for manufacturing a light-emitting diode, and specifically, to a method for improving transverse magnetic (TM) mode light extraction efficiency of an ultraviolet light-emitting diode.

BACKGROUND

Natural ultraviolet light has a high use value, such as an ultraviolet curing function in a UVA band, an ultraviolet medical function in a UVB band, and an ultraviolet sterilization function in a UVC band. However, it is difficult to collect and use natural ultraviolet light. In addition, due to the absorption of the atmosphere, there is almost no UVC band is on earth. Therefore, in order to better utilize ultraviolet light, the development and production of ultraviolet light-emitting diodes has recently become a hot topic in the field of semiconductors.

The ultraviolet light-emitting diodes are light-emitting diodes with wavelengths from 100 nm to 365 nm, which have significant applications in the fields of curing, sterilization, medical treatment, biochemical detection and confidential communication. Compared with a mercury ultraviolet light source, a deep ultraviolet light-emitting diode based on aluminum gallium nitride (AlInGaN) material is gradually used in the traditional application fields of mercury lamps due to the advantages of being robust, energy-saving, durable, and mercury-free environmental friendly. Meanwhile, the unique advantages of the deep ultraviolet light-emitting diodes have stimulated many new applications in consumer electronics, such as sterilization modules for white goods, portable water purification systems, cell phone disinfectors, etc., thus showing a broad market prospect and becoming a global research hotspot.

Currently, the ultraviolet light-emitting diode uses AlInGaN as the main growth material, and a desired light-emitting structure is grown by a CVD epitaxial growth method. The most basic structure contains an AlInGaN buffer layer, an AlInGaN undoped layer, an n-type AlInGaN layer, an AlInGaN quantum well layer, an AlInGaN electron barrier layer, and a P-type AlInGaN layer. As the wavelength reduces, the AlInGaN quantum well layer has a higher Al content. However, as the Al content of the AlInGaN quantum well layer gradually increases, light extraction dominated by the TE mode becomes light extraction dominated by the TM mode. Most of the TM mode ultraviolet light is absorbed inside the material and is not extracted, resulting in a dramatic decrease in the ultraviolet light extraction efficiency.

The light extraction efficiency of the current AlInGaN light-emitting diode is low, and the luminous brightness of a 20 mil×20 mil chip is about 10 mW at a drive current of 100 mA. The low light extraction efficiency leads to low sterilization efficiency, which greatly restricts the use scenarios of ultraviolet light.

SUMMARY

The present disclosure provides a method for improving TM light reflection, to improve TM mode light extraction efficiency of an ultraviolet AlInGaN light-emitting diode, such that light in a TM direction can be fully reflected and extracted desirably, thereby improving the performance of the AlInGaN light-emitting diode.

Objectives to be achieved by the present disclosure at least include: reflecting and extracting ultraviolet light emitted from an AlInGaN quantum well by using an inverted-trapezoid metal layer with high reflectivity for ultraviolet light, to solve the problem of low TM mode light extraction efficiency of ultraviolet light in a conventional AlInGaN quantum well, thereby significantly improving TM mode light extraction efficiency.

To achieve the above objective of the present disclosure, the present disclosure provides the following technical solutions.

The present disclosure provides a method for improving TM mode light extraction efficiency of an ultraviolet AlInGaN light-emitting diode, including the following steps:

(1) growing an epitaxial structure of an AlInGaN light-emitting diode on a substrate, where the epitaxial structure includes an undoped AlInGaN layer, an N-type doped AlInGaN layer, an AlInGaN quantum well layer, an AlInGaN electron barrier layer, and a P-type doped AlInGaN layer;

(2) manufacturing a chip by using the epitaxial wafer grown in step (1), and etching N-electrode regions at an edge and a center of the chip;

(3) growing a passivation layer in the N-electrode regions at the edge and center;

(4) etching the passivation layer to form an inverted trapezoid region, where an N-electrode evaporation region and a reflective metal evaporation region are reserved on a sidewall of the chip;

(5) evaporating N-electrodes in the N-electrode regions at the edge and center, and then evaporating an ultraviolet-reflective metal layer; and (6) finally, evaporating a P-electrode, where the passivation layer between the N-electrode and the P-electrode is used as a current isolation layer.

Preferably, to avoid absorption of ultraviolet, an Al content of the AlInGaN quantum well layer is lower than Al contents of the undoped AlInGaN layer, the N-type doped AlInGaN layer, and the AlInGaN electron barrier layer.

Preferably, the N-electrodes at the edge and center are used for better forming current spreading in an N-type region, and also allowing TM mode light emitted in all directions to be reflected to a front surface of the chip after evaporation of the reflective layer. The shape of the N-electrode is not limited to a regular rectangular strip shape, a corrugated shape or a serrated shape. In addition, one or more central N-electrodes may be provided. An alloy of Ti, Au, Al, Ni, Cr, or Pt is evaporated on the N-electrode to form a good ohmic contact; a thickness of the N-electrode is less than a height from an etching position of the electrode to the AlInGaN quantum well layer.

Preferably, an etching depth of the N-electrode is greater than a total thickness of the quantum well, the electron barrier layer, and the P-type layer, and the N-electrode is etched deep down to a position at a depth of 200 to 100 nm in an N-type region; and the N-electrode region has a width of 1 to 100 μm.

Preferably, the passivation layer of the N-electrode is made of $SiO_2$, $Si_xN$, LiF, or the like. A thickness of the passivation layer is the same as or greater than the etching depth.

Preferably, based on an aspect ratio of etching, the passivation layer is etched to be a reflective layer evaporation region in a shape of an inverted trapezoid, and an inverted-trapezoidal angle of the inverted trapezoid is adjustable. The passivation layer reserved between the inverted-trapezoidal reflective layer evaporation region and a sidewall of the chip has a minimum width of 200 nm to 50 μm, to form a desirable current isolation region.

Preferably, the inverted-trapezoidal reflective metal layer is made of a metal with high reflectivity for ultraviolet light, such as Al, Pt, Mg, or Rh, and a compound thereof. The thickness of the reflective metal layer is required to be greater than that of the AlInGaN quantum well layer, such that all ultraviolet light generated in the AlInGaN quantum well layer can be reflected to a surface of the substrate through an inverted-trapezoidal metal reflective layer to be extracted. Such an inverted-trapezoidal reflection structure can effectively improve the extraction efficiency of the ultraviolet light, because the reflected ultraviolet light will not continuously propagate in a TM direction in the material, and thus is not absorbed by the material.

Preferably, an ohmic contact layer of the P-electrode is made of an alloy of Ti, Au, Al, Ni, Cr, Pt or the like. To reduce absorption of ultraviolet light by the contact layer of the electrode, the thickness of a P contact electrode alloy layer is reduced to be as low as possible, where the thickness of the P contact electrode alloy layer is less than 20 nm. Then, the P contact electrode alloy layer is thickened by using Al, Pt, Mg, Rh or an alloy thereof to reach a thickness of 50 to 1000 nm, thereby achieving a good reflective function for ultraviolet light.

Preferably, to enable the ultraviolet light to be extracted from the surface of the substrate, the substrate is made of a material with a high energy gap or the substrate is removed.

The present disclosure has the following advantages:

(1) The ultraviolet light extraction efficiency is improved in a manner different from a conventional method of purely increasing internal quantum efficiency, which is simpler and more efficient.

(2) The inverted-trapezoidal reflective metal layer is made of a metal with high reflectivity for ultraviolet light, such as Al, Pt, Mg, or Rh. and a compound thereof. The thickness of the reflective metal layer is greater than that of the AlInGaN quantum well layer, such that all ultraviolet light generated in the AlInGaN quantum well layer can be reflected to a surface of the substrate through an inverted-trapezoidal metal reflective layer to be extracted. Such an inverted-trapezoidal reflection structure can effectively improve the extraction efficiency of the ultraviolet light, because the reflected ultraviolet light will not continuously propagate in a TM direction in the material, and thus is not absorbed by the material.

(3) The present disclosure is achievable under simple conditions, which facilitates industrial production.

DETAILED DESCRIPTION OF THE EMBODIMENTS

In order to make the objectives, technical solutions and advantages of the embodiments of the present disclosure clearer, the implementations of the present application are described in detail below with reference to the drawings. Those of ordinary skill in the art should understand that many technical details are proposed in the embodiments of the present disclosure to make the present disclosure better understood. However, even without these technical details and various changes and modifications made based on the following embodiments, the technical solutions claimed in the present disclosure may still be realized. The following divisions of the various embodiments are intended for convenience of description, and are not intended to constitute any limitation to the specific implementation of the present disclosure. The various embodiments may be combined with each other and cross-referenced in case of no contradiction.

Embodiment 1

Figure 1:
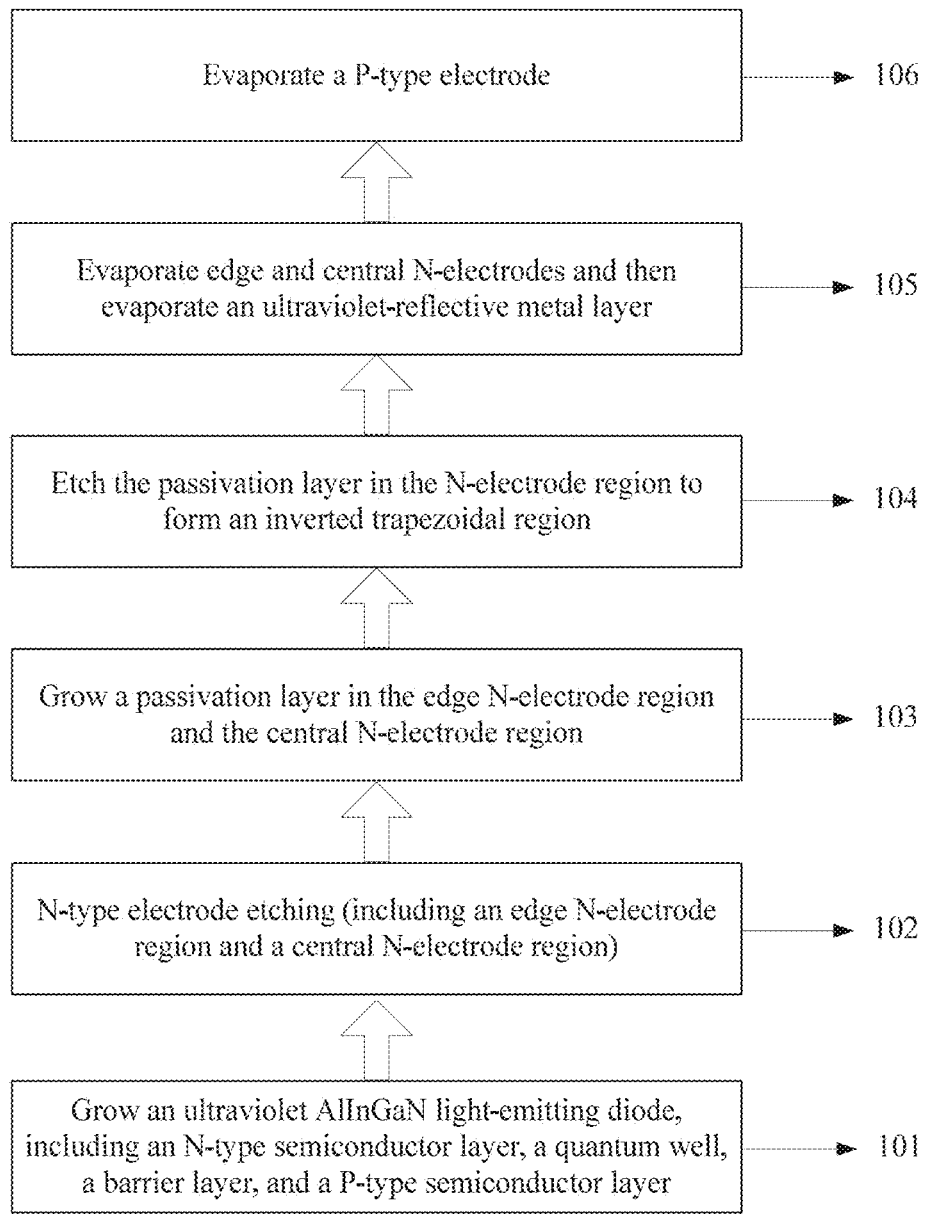
FIG. 1 is a schematic flowchart of a method for improving TM mode light extraction efficiency of an ultraviolet AlInGaN light-emitting diode according to the present disclosure.
Figure 2:
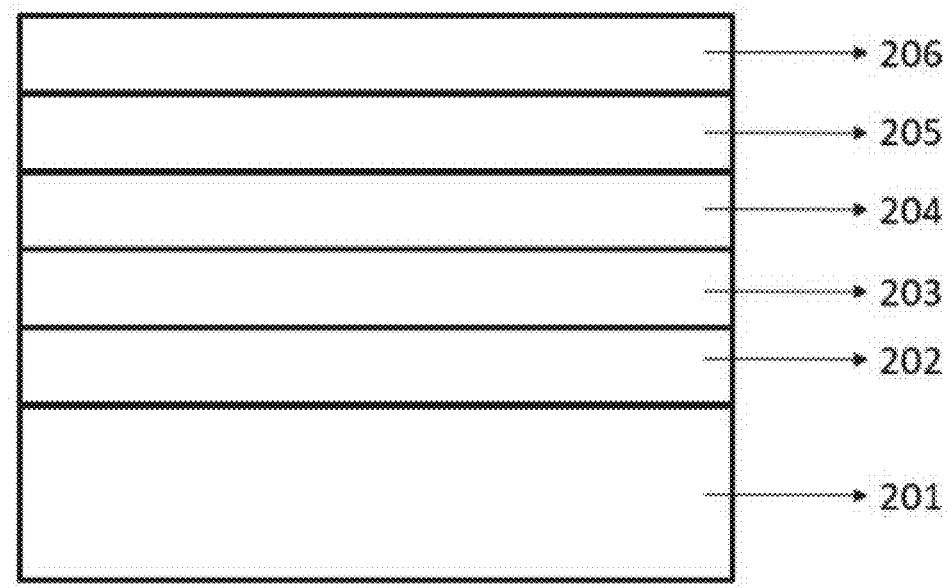
FIG. 2 is a schematic structural diagram of the ultraviolet AlInGaN light-emitting diode according to the present disclosure, where meanings of reference numerals are as follows: 201: substrate material; 202: undoped AlInGaN layer; 203: N-type doped AlInGaN layer; 204: AlInGaN quantum well layer; 205: AlInGaN electron barrier layer; 206: P-type doped AlInGaN layer.

A method for improving TM mode light extraction efficiency of an ultraviolet AlInGaN light-emitting diode is described as follows:

(1) Referring to FIG. 2, a sapphire-pattern substrate 201 was placed into a high-temperature metal-organic chemical vapor deposition (MOCVD), and hydrogen was injected. The substrate was baked at a high temperature of 1100° C., and oxides and impurities on a surface of the substrate were washed away.

(2) An undoped AlN layer 202 was grown at a high temperature, where a thickness of the AlN layer was controlled to be 3 μm.

Figure 6:
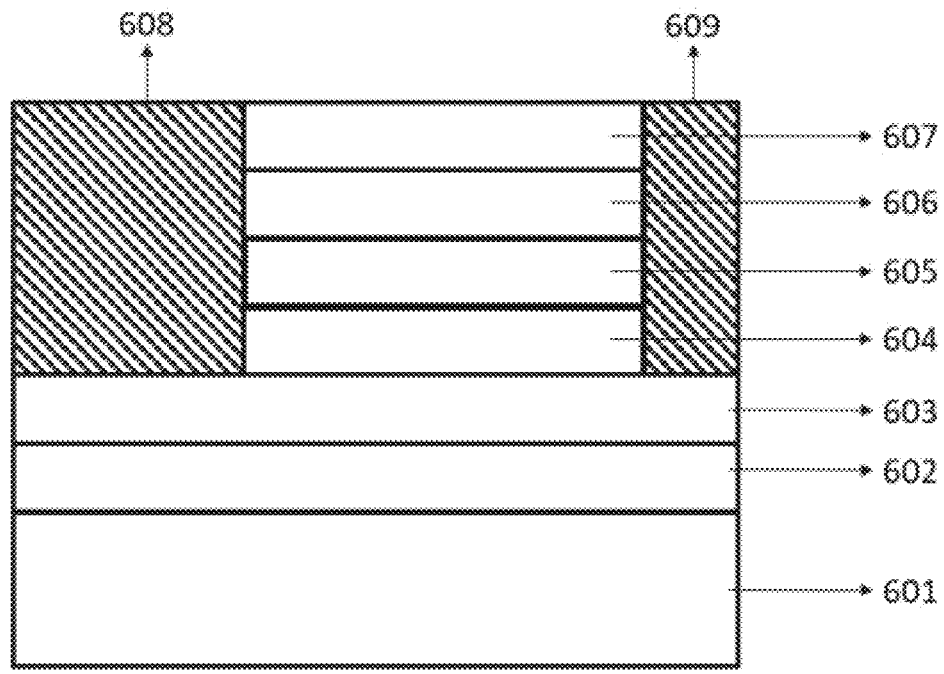
FIG. 6 is a cross-sectional view of growth of a passivation layer in an N-electrode region, where meanings of reference numerals are as follows: 601: substrate material; 602: undoped AlInGaN layer; 603: N-type doped AlInGaN layer; 604: N-type doped AlInGaN layer; 605: AlInGaN quantum well layer; 606: AlInGaN electron barrier layer; 607: P-type doped AlInGaN contact layer; 608: central N-electrode region passivation layer; 609: edge N-electrode region passivation layer.
Figure 7:
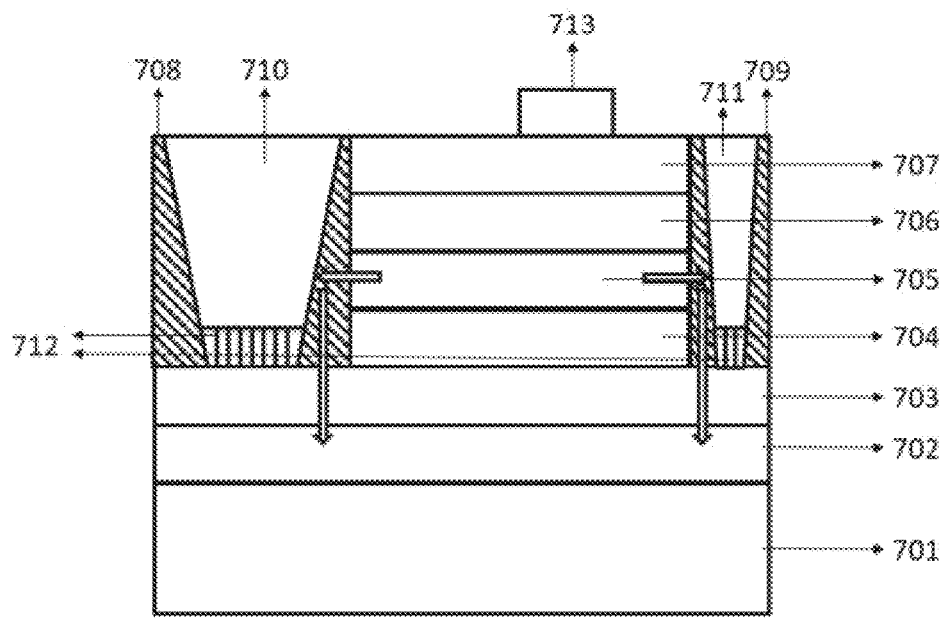
FIG. 7 is a cross-sectional view of an inverted-trapezoidal reflective metal layer, where meanings of reference numerals are as follows: 701: substrate material; 702: undoped AlInGaN layer; 703: N-type doped AlInGaN layer; 704: N-type doped AlInGaN layer; 705: AlInGaN quantum well layer; 706: AlInGaN electron barrier layer; 707: P-type doped AlInGaN layer; 708: central N-electrode region passivation layer; 709: edge N-electrode region passivation layer; 710: inverted-trapezoidal reflective metal layer of central N-electrode region; 711: inverted-trapezoidal reflective metal layer of edge N-electrode region; 712: N-electrode metal layer; 713: P-electrode metal layer.
Figure 8:
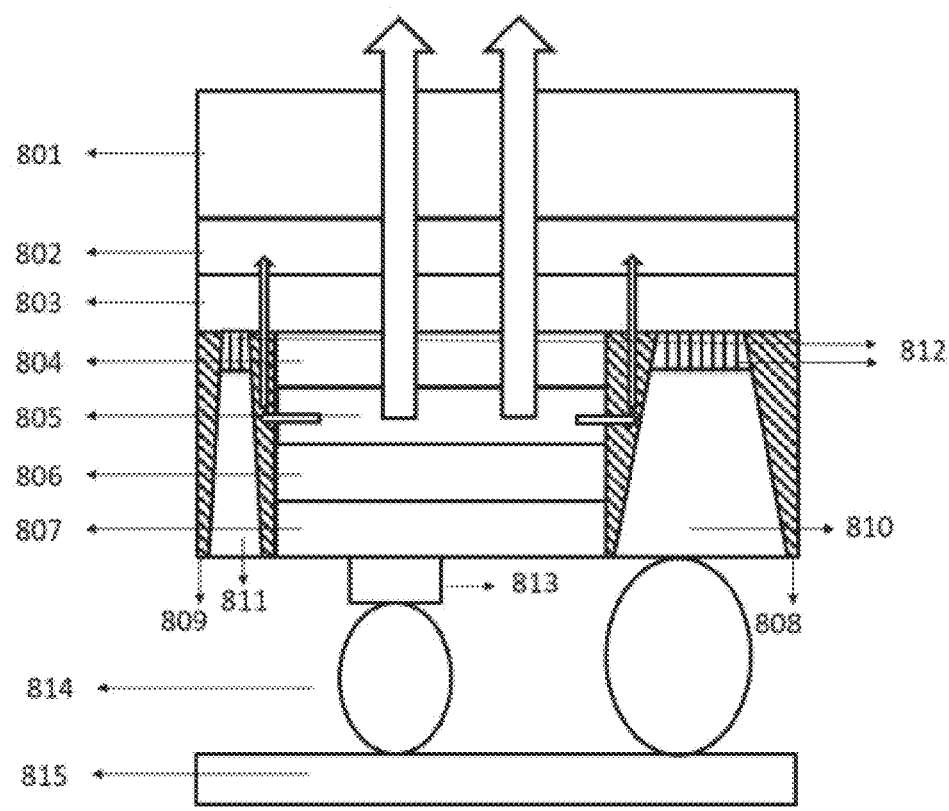
FIG. 8 is a schematic diagram of a flip chip, where meanings of reference numerals are as follows: 801: substrate material; 802: undoped AlInGaN layer; 803: N-type doped AlInGaN layer; 804: N-type doped AlInGaN layer; 805: AlInGaN quantum well layer; 806: AlInGaN electron barrier layer; 807: P-type doped AlInGaN layer; 808: central N-electrode region passivation layer; 809: edge N-electrode region passivation layer; 810: central ultraviolet-reflective metal layer; 811: edge ultraviolet-reflective metal layer; 812: N-electrode metal layer; 813: P-electrode metal layer; 814: alloy point; 815: base.

(3) An N-type $Al_{0.6}Ga_{0.4}N$ layer 203 was further grown on the undoped AlN layer, where the N-type $Al_{0.6}Ga_{0.4}N$ layer had a thickness of 2 μm. The N-type AlGaN layer 203 was used for forming a good N-type ohmic contact. Herein, a low Al content was preferred. However, a lower Al content causes a higher ultraviolet absorption rate. Experiments indicated that a good effect was achieved when the Al content was 60%. Referring to FIG. 6 to FIG. 8, another N-type layer 604/704/804 may further be grown here.

(4) The temperature was adjusted to a temperature for growing quantum wells, to grow a structure of $Al_{0.25}In_{0.01}Ga_{0.74}N/Al_{0.5}In_{0.01}Ga_{0.49}N$ multi-quantum well 204/605/705/805, where a period thickness was 14 nm ($Al_{0.25}In_{0.01}Ga_{0.74}N$ was a quantum well layer with a well width of 2 nm, and $Al_{0.5}In_{0.01}Ga_{0.49}N$ was a quantum barrier layer with a barrier width of 12 nm), and the number of periods was 6. Herein, a larger number of periods corresponds to a larger number of light-emitting layers and higher brightness. However, an excessive number of periods will restrict total hole injection, increase the resistivity of the entire structure and reduce the quality of the material.

(5) An $Al_{0.60}In_{0.01}Ga_{0.39}N$ electron barrier layer 205/606/706/806 having a thickness of 40 nm was grown on the structure of multi-quantum well that had been grown, where an Al content of the barrier layer was higher than an Al content in the quantum barrier.

(6) Then, a P-type $Al_{0.40}In_{0.01}Ga_{0.59}N$ contact layer 206/707/807 having a high hole concentration and a low ultraviolet absorption rate was further grown, where a thickness of the P-type contact layer was 150 nm. The P-type AlGaN was used for forming a good P-type ohmic contact. Herein, a low Al content was preferred. However, a lower Al content causes a higher ultraviolet absorption rate. Therefore, an appropriate Al content needs to be configured.

Figure 3:
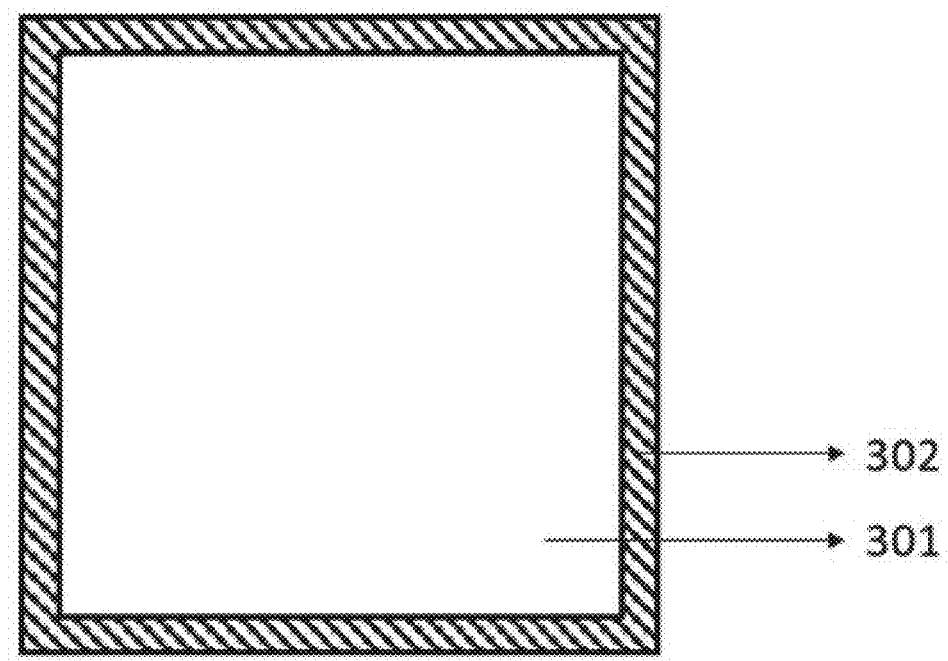
FIG. 3 is a planar schematic diagram of an edge N-electrode, where meanings of reference numerals are as follows: 301: chip central region; 302: edge N-electrode region.
Figure 4:
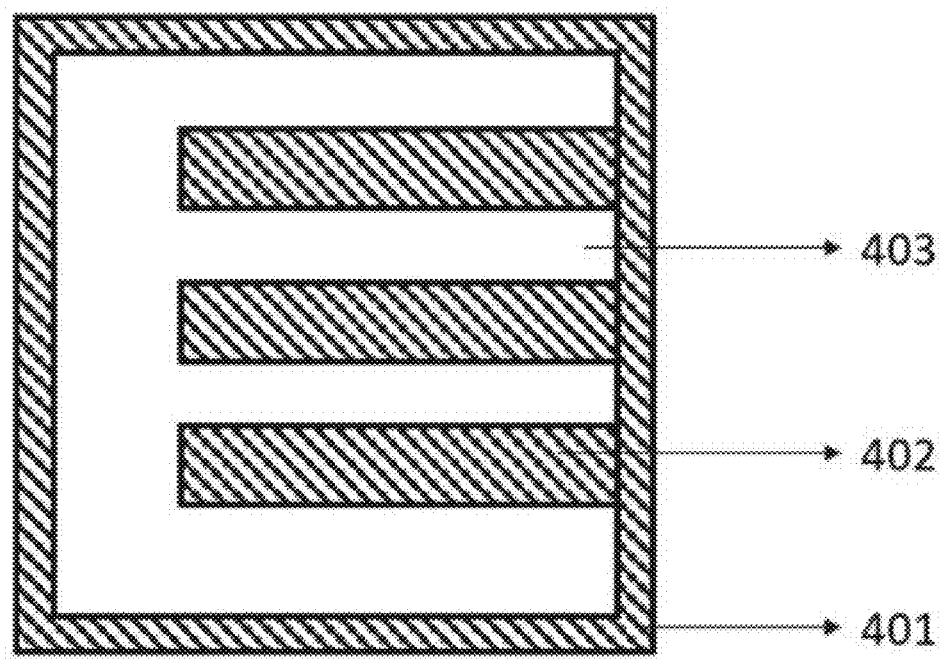
FIG. 4 is a planar schematic diagram of a central N-electrode, where meanings of reference numerals are as follows: 401: edge N-electrode region; 402: central N-electrode region; 403: central non-electrode region.
Figure 5:
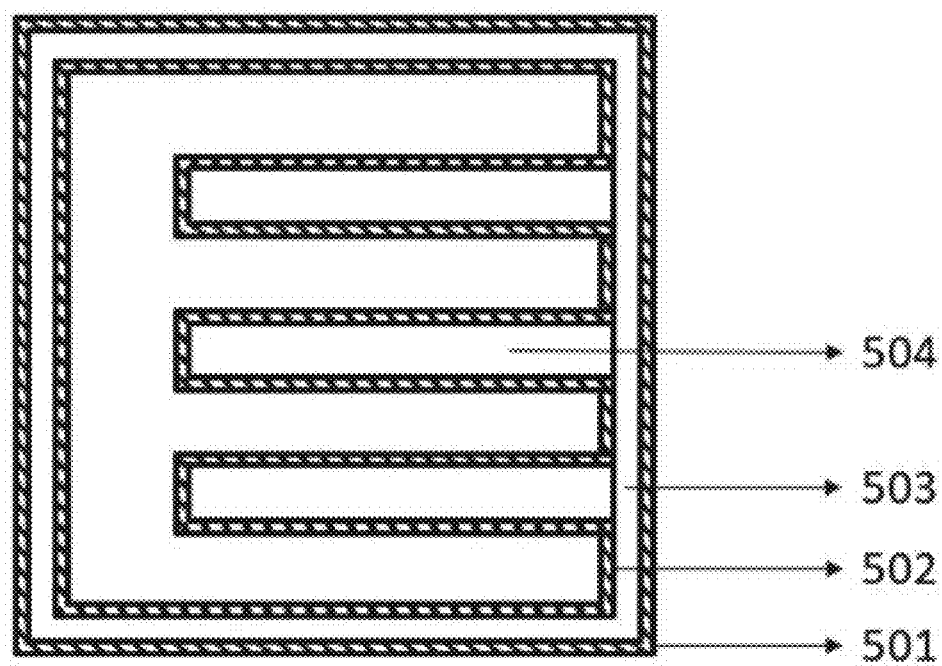
FIG. 5 is a planar schematic diagram of an inverted-trapezoid ultraviolet reflective metal layer, where meanings of reference numerals are as follows: 501: edge electrode passivation layer; 502: chip sidewall passivation layer; 503: inverted-trapezoid ultraviolet reflective metal layer of edge electrode region; 504: inverted-trapezoidal ultraviolet reflective metal layer of central electrode region.

(7) A surface of a grown epitaxial wafer was cleaned to manufacture a chip having a size of 500 μm×500 μm. An edge N-electrode was etched. Referring to FIG. 3 and FIG. 4, the edge N-electrode 302/401 has a width of 20 μm and an etching depth of 500 nm. Electrodes 402 in a central region are in the shape of three rectangles. The rectangle has a width of 50 μm and a length of 300 μm, and an etching depth is 500 nm. Herein, the electrode was etched deep down to an N-type doped AlGaN layer 203/603.

(8) A $SiO_2$ passivation layer 608/609 was evaporated in the central N-electrode region and the edge N-electrode region.

(9) Inverted trapezoidal etching was performed on the $SiO_2$ passivation layer. The top side of the inverted trapezoid of the N-electrode in the central region has a length of 46 μm, where a passivation layer 708/808 with a width of 2 μm was retained on a sidewall region of the chip during etching. The short side at the bottom had a length of 40 μm, where the passivation layer with a width of 5 μm was retained on the sidewall region of the chip during etching. The top side of the inverted trapezoid of the N-electrode in the edge region had a length of 16 μm, where a passivation layer 709/80) with a width of 2 μm was retained on the sidewall region of the chip during etching. The short side at the bottom had a length of 10 μm, where the passivation layer with a width of 5 μm was retained on the sidewall region of the chip during etching. Herein, the passivation layer with a certain width was retained to avoid electrical leakage caused by conduction between the electrode and the reflective metal layer.

(10) At the bottom of the inverted trapezoid of the N-electrode in the central region and the bottom of the inverted trapezoid of the N-electrode in the edge region. Ti/Au was evaporated to serve as an N-electrode layer 712/812 with a thickness of 100 nm/100 nm, to form a good ohmic contact.

(11) Metal Al was further evaporated on the Ti/Au layer 712 to serve as an ultraviolet reflective layer 710/810 or 711/811, where an evaporation thickness was 300 nm, such that all ultraviolet light emitted by the quantum well can be reflected. Herein, the thickness of the reflective metal layer herein was required to be greater than that of the AlInGaN quantum well layer, such that all ultraviolet light generated in the AlInGaN quantum well layer can be reflected to a surface of the substrate through the inverted-trapezoidal metal reflective layer to be extracted. Such an inverted-trapezoidal reflection structure can effectively improve the extraction efficiency of the ultraviolet light, because the reflected ultraviolet light will not continuously propagate in a TM direction in the material, and thus is not absorbed by the material.

(12) On this basis, a Ni/Au alloy was evaporated to serve as a P-type electrode layer 713/813 with a thickness of 1 nm/10 nm, to form a good P-type ohmic contact. Metal Al was further evaporated to reach a thickness of 500 nm, to achieve good ultraviolet reflection in the P-type region.

(13) A flip chip was manufactured, where the N-electrode Ti/Au layer 712/812 was electrically connected to an alloy point 814 through the metal ultraviolet reflective layer 710/810, so as to be electrically connected to a base 815, and the P-type electrode layer 713/813 was electrically connected to the base 815 through the alloy point 814. The TM mode ultraviolet light was extracted efficiently through the surface of the substrate.

(14) With the chip size of 500 μm×500 μm, a current of 100 mA was switched on, where a wavelength was 275 nm and brightness was 30 mW.

Embodiment 2

A method for improving TM mode light extraction efficiency of an ultraviolet AlInGaN light-emitting diode is described as follows:

(1) A sapphire-pattern substrate was placed into a high-temperature MOCVD device, and hydrogen was injected. The substrate was baked at a high temperature of 1100° C., and oxides and impurities on a surface of the substrate were washed away.

(2) An undoped $Al_{0.98}Ga_{0.02}N$ layer was grown at a high temperature, where a thickness of the $Al_{0.98}Ga_{0.02}N$ layer was controlled to be 3 μm.

(3) An N-type $Al_{0.5}Ga_{0.2}N$ layer was further grown on the undoped $Al_{0.98}Ga_{0.02}N$ layer, where the N-type $Al_{0.5}Ga_{0.2}N$ layer had a thickness of 2 μm.

(4) The temperature was adjusted to a temperature for growing a quantum well, to grow a structure of $Al_{0.35}In_{0.01}Ga_{0.64}N/Al_{0.5}In_{0.01}Ga_{0.49}N$ multi-quantum well, where a period thickness was 15 nm (a well width was 4 nm, and a barrier width was 11 nm), and the number of periods was 5.

(5) An $Al_{0.60}In_{0.01}Ga_{0.39}N$ layer having a thickness of 50 nm was grown on the structure of multi-quantum well that had been grown.

(6) Then, an $Al_{0.45}In_{0.01}Ga_{0.4}N$ layer having a high hole concentration and a low ultraviolet absorption rate was further grown, where a thickness of the P-type contact layer was 100 nm.

(7) A surface of a grown epitaxial wafer was cleaned to manufacture a chip having a size of 500 μm×500 μm. An edge N-electrode was etched, where the edge N-electrode had a width of 30 μm and an etching depth of 800 nm. Electrodes in a central region were in the shape of four rectangles. The rectangle had a width of 40 μm and a length of 300 μm, and an etching depth was 800 nm.

(8) A $SiO_2$ passivation layer was evaporated in the central N-electrode region and the edge N-electrode region.

(9) Inverted trapezoidal etching was performed on the $SiO_2$ passivation layer. The top side of the inverted trapezoid of the N-electrode in the central region had a length of 34 μm, where a passivation layer with a width of 3 μm was retained on a sidewall region of the chip during etching. The short side at the bottom had a length of 20 μm, where the passivation layer with a width of 10 μm was retained on the sidewall region of the chip during etching. The top side of the inverted trapezoid of the N-electrode in the edge region had a length of 26 μm, where a passivation layer with a width of 2 μm was retained on the sidewall region of the chip during etching. The short side at the bottom had a length of 10 μm, where the passivation layer with a width of 10 μm was retained on the sidewall region of the chip during etching.

(10) At the bottom of the inverted trapezoid of the N-electrode in the central region and the bottom of the inverted trapezoid of the N-electrode in the edge region, Ti/Au was evaporated on the N-electrode to reach a thickness of 100 nm/200 nm, to form a good ohmic contact.

(11) Metal Rh was further evaporated to serve as an ultraviolet reflective layer, where an evaporation thickness was 500 nm, such that all ultraviolet light emitted by the quantum well can be reflected.

(12) On this basis, a Ni/Au alloy was evaporated to serve as a P-type electrode with a thickness of 1 nm/10 nm, to form a good P-type ohmic contact. Metal Rh was further evaporated to reach a thickness of 500 nm, to achieve good ultraviolet reflection in the P-type region.

(13) The chip was manufactured into a flip chip, and the TM mode ultraviolet light was extracted efficiently through the surface of the substrate.

(14) With the chip size of 500 μm×500 μm, a current of 100 mA was switched on, where a wavelength was 265 nm and brightness was 30 mW.

Embodiment 3

A method for improving TM mode light extraction efficiency of an ultraviolet AlInGaN light-emitting diode is described as follows:

(1) A sapphire-pattern substrate was placed into a high-temperature MOCVD device, and hydrogen was injected. The substrate was baked at a high temperature of 1100° C., and oxides and impurities on a surface of the substrate were washed away.

(2) An undoped AlN layer was grown at a high temperature, where a thickness of the AlN layer was controlled to be 5 μm.

(3) An N-type $Al_{0.5}Ga_{0.2}N$ layer was further grown on the undoped AlN layer, where the N-type $Al_{0.5}Ga_{0.2}N$ layer had a thickness of 2 μm. An N-type $Al_{0.5}Ga_{0.5}N$ layer was further grown, where the N-type $Al_{0.5}Ga_{0.5}N$ layer had a thickness of 1 μm.

(4) The temperature was adjusted to a temperature for growing a quantum well, to grow a structure of $Al_{0.30}In_{0.01}Ga_{0.69}N/Al_{0.55}In_{0.01}Ga_{0.44}N$ multi-quantum well, where a period thickness was 10 nm (a well width was 1 nm, and a barrier width was 9 nm), and the number of periods was 10.

(5) An $Al_{0.70}In_{0.01}Ga_{0.29}N$ layer having a thickness of 50 nm was grown on the structure of multi-quantum well that had been grown.

(6) Then, an $Al_{0.42}In_{0.01}Ga_{0.57}N$ layer having a high hole concentration and a low ultraviolet absorption rate was further grown, where a thickness of the P-type contact layer was 250 nm.

(7) A surface of a grown epitaxial wafer was cleaned to manufacture a chip having a size of 500 μm×500 μm. An edge N-electrode was etched, where the edge N-electrode had a width of 30 μm and an etching depth of 800 nm. Electrodes in a central region were in the shape of five rectangles. The rectangle had a width of 30 μm and a length of 300 μm, and an etching depth was 800 nm.

(8) A $SiO_2$ passivation layer was evaporated in the central N-electrode region and the edge N-electrode region.

(9) Inverted trapezoidal etching was performed on the $SiO_2$ passivation layer. The top side of the inverted trapezoid of the N-electrode in the central region had a length of 26 μm, where a passivation layer with a width of 2 μm was retained on a sidewall region of the chip during etching. The short side at the bottom had a length of 16 μm, where the passivation layer with a width of 7 μm was retained on the sidewall region of the chip during etching. The top side of the inverted trapezoid of the N-electrode in the edge region had a length of 26 μm, where a passivation layer with a width of 2 μm was retained on the sidewall region of the chip during etching. The short side at the bottom had a length of 16 μm, where the passivation layer with a width of 7 μm was retained on the sidewall region of the chip during etching.

(10) At the bottom of the inverted trapezoid of the N-electrode in the central region and the bottom of the inverted trapezoid of the N-electrode in the edge region, Ti/Au was evaporated on the N-electrode to reach a thickness of 50 nm/250 nm, to form a good ohmic contact.

(11) Metal Al was further evaporated to serve as an ultraviolet reflective layer, where an evaporation thickness was 500 nm, such that all ultraviolet light emitted by the quantum well can be reflected.

(12) On this basis, a Ni/Pt alloy was evaporated to serve as a P-type electrode with a thickness of 2 nm/5 nm, to form a good P-type ohmic contact. Metal Al was further evaporated to reach a thickness of 500 nm, to achieve good ultraviolet reflection in the P-type region.

(13) The chip was manufactured into a flip chip, and the TM mode ultraviolet light was extracted efficiently through the surface of the substrate.

(14) With the chip size of 500 μm×500 μm, a current of 100 mA was switched on, where a wavelength was 270 nm and brightness was 35 mW.

Embodiment 4

A method for improving TM mode light extraction efficiency of an ultraviolet AlInGaN light-emitting diode is described as follows:

(1) A sapphire-pattern substrate was placed into a high-temperature MOCVD device, and hydrogen was injected. The substrate was baked at a high temperature of 1100° C., and oxides and impurities on a surface of the substrate were washed away.

(2) An undoped AlN layer was grown at a high temperature, where a thickness of the AlN layer was controlled to be 5 μm.

(3) An N-type $Al_{0.5}Ga_{0.2}N$ layer was further grown on the undoped AlN layer, where the N-type $Al_{0.8}Ga_{0.2}N$ layer had a thickness of 2 μm. An N-type $Al_{0.5}Ga_{0.5}N$ layer was further grown, where the N-type $Al_{0.5}Ga_{0.5}N$ layer had a thickness of 1 μm.

(4) The temperature was adjusted to a temperature for growing a quantum well, to grow a structure of $Al_{0.50}In_{0.01}Ga_{0.69}N/Al_{0.5}In_{0.01}Ga_{0.44}N$ multi-quantum well, where a period thickness was 10 nm (a well width was 1 nm, and a barrier width was 9 nm), and the number of periods was 10.

(5) An $Al_{0.70}In_{0.01}Ga_{0.29}N$ layer having a thickness of 50 nm was grown on the structure of multi-quantum well that had been grown.

(6) Then, an $Al_{0.42}In_{0.01}Ga_{0.57}N$ layer having a high hole concentration and a low ultraviolet absorption rate was further grown, where a thickness of the P-type contact layer was 250 nm.

(7) A surface of a grown epitaxial wafer was cleaned to manufacture a chip having a size of 1000 μm×1000 μm. An edge N-electrode was etched, where the edge N-electrode had a width of 20 μm and an etching depth of 800 nm. Electrodes in a central region were in the shape of ten rectangles. The rectangle had a width of 40 μm and a length of 700 μm, and an etching depth was 800 nm.

(8) A $SiO_2$ passivation layer was evaporated in the central N-electrode region and the edge N-electrode region.

(9) Inverted trapezoidal etching was performed on the $SiO_2$ passivation layer. The top side of the inverted trapezoid of the N-electrode in the central region had a length of 38 μm, where a passivation layer with a width of 1 μm was retained on a sidewall region of the chip during etching. The short side at the bottom had a length of 20 μm, where the passivation layer with a width of 10 μm was retained on the sidewall region of the chip during etching. The top side of the inverted trapezoid of the N-electrode in the edge region had a length of 18 μm, where a passivation layer with a width of 1 μm was retained on the sidewall region of the chip during etching. The short side at the bottom had a length of 10 μm, where the passivation layer with a width of 5 μm was retained on the sidewall region of the chip during etching.

(10) At the bottom of the inverted trapezoid of the N-electrode in the central region and the bottom of the inverted trapezoid of the N-electrode in the edge region, Ti/Au was evaporated on the N-electrode to reach a thickness of 50 nm/300 nm, to form a good ohmic contact.

(11) Metal Al was further evaporated to serve as an ultraviolet reflective layer, where an evaporation thickness was 450 nm, such that all ultraviolet light emitted by the quantum well can be reflected.

(12) On this basis, a Ni/Pt alloy was evaporated to serve as a P-type electrode with a thickness of 2 nm/5 nm, to form a good P-type ohmic contact. Metal Al was further evaporated to reach a thickness of 500 nm, to achieve good ultraviolet reflection in the P-type region.

(13) The chip was manufactured into a flip chip, and the TM mode ultraviolet light was extracted efficiently through the surface of the substrate.

(14) With the chip size of 1000 μm×1000 μm, a current of 350 mA was switched on, where a wavelength was 270 nm and brightness was 100 mW.

Embodiment 5

A method for improving TM mode light extraction efficiency of an ultraviolet AlInGaN light-emitting diode is described as follows:

(1) A sapphire-pattern substrate was placed into a high-temperature MOCVD device, and hydrogen was injected. The substrate was baked at a high temperature of 1100° C., and oxides and impurities on a surface of the substrate were washed away.

(2) An undoped AN layer was grown at a high temperature, where a thickness of the AlN layer was controlled to be 5 μm.

(3) An N-type $Al_{0.8}Ga_{0.2}N$ layer was further grown on the undoped AlN layer, where the N-type $Al_{0.8}Ga_{0.2}N$ layer had a thickness of 2 μm. An N-type $Al_{0.5}Ga_{0.5}N$ layer was further grown, where the N-type $Al_{0.5}Ga_{0.5}N$ layer had a thickness of 1 μm.

(4) The temperature was adjusted to a temperature for growing a quantum well, to grow a structure of $Al_{0.30}In_{0.01}Ga_{0.69}N/Al_{0.55}In_{0.01}Ga_{0.44}N$ multi-quantum well, where a period thickness was 10 nm (a well width was 1 nm, and a barrier width was 9 nm), and the number of periods was 10.

(5) An $Al_{0.70}In_{0.01}Ga_{0.29}N$ layer having a thickness of 50 nm was grown on the structure of multi-quantum well that had been grown.

(6) Then, an $Al_{0.42}In_{0.01}Ga_{0.57}N$ layer having a high hole concentration and a low ultraviolet absorption rate was further grown, where a thickness of the P-type contact layer was 250 nm.

(7) A surface of a grown epitaxial wafer was cleaned to manufacture a chip having a size of 1000 μm×1000 μm. An edge N-electrode was etched, where the edge N-electrode had a width of 20 μm and an etching depth of 800 nm. Electrodes in a central region were in the shape of ten rectangles. The rectangle had a width of 40 μm and a length of 700 μm, and an etching depth was 800 nm.

(8) A $SiO_2$ passivation layer was evaporated in the central N-electrode region and the edge N-electrode region.

(9) Inverted trapezoidal etching was performed on the $SiO_2$ passivation layer. The top side of the inverted trapezoid of the N-electrode in the central region had a length of 38 μm, where a passivation layer with a width of 1 μm was retained on a sidewall region of the chip during etching. The short side at the bottom had a length of 20 μm, where the passivation layer with a width of 10 μm was retained on the sidewall region of the chip during etching. The top side of the inverted trapezoid of the N-electrode in the edge region had a length of 18 μm, where a passivation layer with a width of 1 μm was retained on the sidewall region of the chip during etching. The short side at the bottom had a length of 10 μm, where the passivation layer with a width of 5 μm was retained on the sidewall region of the chip during etching.

(10) At the bottom of the inverted trapezoid of the N-electrode in the central region and the bottom of the inverted trapezoid of the N-electrode in the edge region, Ti/Au was evaporated on the N-electrode to reach a thickness of 50 nm/300 nm, to form a good ohmic contact.

(11) Metal Mg was further evaporated to serve as an ultraviolet reflective layer, where an evaporation thickness was 450 nm, such that all ultraviolet light emitted by the quantum well can be reflected.

(12) On this basis, a Ni/Pt alloy was evaporated to serve as a P-type electrode with a thickness of 2 nm/5 nm, to form a good P-type ohmic contact. Metal Mg was further evaporated to reach a thickness of 500 nm, to achieve good ultraviolet reflection in the P-type region.

(13) The chip was manufactured into a flip chip, and the TM mode ultraviolet light was extracted efficiently through the surface of the substrate.

(14) With the chip size of 1000 μm×1000 μm, a current of 350 mA was switched on, where a wavelength was 270 nm and brightness was 100 mW.

Embodiment 6

A method for improving TM mode light extraction efficiency of an ultraviolet AlInGaN light-emitting diode is described as follows:

(1) A sapphire-pattern substrate was placed into a high-temperature MOCVD device, and hydrogen was injected. The substrate was baked at a high temperature of 1100° C., and oxides and impurities on a surface of the substrate were washed away.

(2) An undoped AlN layer was grown at a high temperature, where a thickness of the AlN layer was controlled to be 5 μm.

(3) An N-type $Al_{0.5}Ga_{0.2}N$ layer was further grown on the undoped AlN layer, where the N-type $Al_{0.8}Ga_{0.2}N$ layer had a thickness of 2 μm. An N-type $Al_{0.5}Ga_{0.5}N$ layer was further grown, where the N-type $Al_{0.5}Ga_{0.5}N$ layer had a thickness of 1 μm.

(4) The temperature was adjusted to a temperature for growing a quantum well, to grow a structure of $Al_{0.30}In_{0.01}Ga_{0.69}N/Al_{0.55}In_{0.01}Ga_{0.44}N$ multi-quantum well, where a period thickness was 10 nm (a well width was 1 nm, and a barrier width was 9 nm), and the number of periods was 10.

(5) An $Al_{0.70}In_{0.01}Ga_{0.29}N$ layer having a thickness of 50 nm was grown on the structure of multi-quantum well that had been grown.

(6) Then, an $Al_{0.42}In_{0.01}Ga_{0.57}N$ layer having a high hole concentration and a low ultraviolet absorption rate was further grown, where a thickness of the P-type contact layer was 250 nm.

(7) A surface of a grown epitaxial wafer was cleaned to manufacture a chip having a size of 1000 μm×1000 μm. An edge N-electrode was etched, where the edge N-electrode had a width of 20 μm and an etching depth of 1000 nm. Electrodes in a central region were in the shape of 20 rectangles. The rectangle had a width of 20 μm and a length of 700 μm, and an etching depth was 1000 nm.

(8) A $SiO_2$ passivation layer was evaporated in the central N-electrode region and the edge N-electrode region.

(9) Inverted trapezoidal etching was performed on the $SiO_2$ passivation layer. The top side of the inverted trapezoid of the N-electrode in the central region had a length of 18 μm, where a passivation layer with a width of 1 μm was retained on a sidewall region of the chip during etching. The short side at the bottom had a length of 10 μm, where the passivation layer with a width of 5 μm was retained on the sidewall region of the chip during etching. The top side of the inverted trapezoid of the N-electrode in the edge region had a length of 18 μm, where a passivation layer with a width of 1 μm was retained on the sidewall region of the chip during etching. The short side at the bottom had a length of 10 μm, where the passivation layer with a width of 5 μm was retained on the sidewall region of the chip during etching.

(10) At the bottom of the inverted trapezoid of the N-electrode in the central region and the bottom of the inverted trapezoid of the N-electrode in the edge region, Ti/Au was evaporated on the N-electrode to reach a thickness of 100 nm/300 nm, to form a good ohmic contact.

(11) An Al/Rh alloy was further evaporated to serve as an ultraviolet reflective layer, where an evaporation thickness was 600 nm, such that all ultraviolet light emitted by the quantum well can be reflected.

(12) On this basis, a Ni/Pt alloy was evaporated to serve as a P-type electrode with a thickness of 2 nm/5 nm, to form a good P-type ohmic contact. Metal Al/Rh was further evaporated to reach a thickness of 1000 nm, to achieve good ultraviolet reflection in the P-type region.

(13) The chip was manufactured into a flip chip, and the TM mode ultraviolet light was extracted efficiently through the surface of the substrate.

(14) With the chip size of 1000 μm×1000 μm, a current of 350 mA was switched on, where a wavelength was 270 nm and brightness was 120 mW.

Embodiment 7

Referring to FIG. 8, a structure of a flip chip is as follows:
801: substrate material;

802: undoped AlInGaN layer;
803: N-type AlInGaN layer;
804: N-type AlInGaN layer;
805: AlInGaN quantum well layer;
806: AlInGaN electron barrier layer;
807: P-type AlInGaN contact layer;
808: passivation layer of central N-electrode region;
809: passivation layer of edge N-electrode region;
810: inverted-trapezoidal reflective metal layer of central N-electrode region;
811: inverted-trapezoidal reflective metal layer of edge N-electrode region;
812: N-electrode metal layer;
813: P-electrode metal layer;
814: alloy point; and
815: base.

For properties and parameters of the structure of each layer, refer to the description on the properties and parameters of the structure of each layer in Embodiment 1 to Embodiment 6.

The above descriptions are merely preferred implementations of the present disclosure. It should be noted that a person of ordinary skill in the art may further make several improvements and modifications without departing from the principle of the present disclosure, but such improvements and modifications should be deemed as falling within the protection scope of the present disclosure.

What is claimed is:

1. A method for improving transverse magnetic (TM) mode light extraction efficiency of an ultraviolet AlInGaN light-emitting diode, comprising the following steps:
   (1) growing an epitaxial structure of an AlInGaN light-emitting diode on a substrate, wherein the epitaxial structure comprises an undoped AlInGaN layer, an N-type doped AlInGaN layer, an AlInGaN quantum well layer, an AlInGaN electron barrier layer, and a P-type doped AlInGaN layer;
   (2) manufacturing a chip by using the epitaxial wafer grown in step (1), etching N-electrode regions at an edge and a center of the chip, and etching the epitaxial wafer to obtain a first N-electrode region at an edge and a second N-electrode region at a centre;
   (3) growing a passivation layer in the first N-electrode region and the second N-electrode region;
   (4) etching the passivation layer, wherein a remaining portion after the etching is in an inverted trapezoidal shape, and an N-electrode evaporation region and a reflective metal evaporation region are reserved on a sidewall of the chip;
   (5) sequentially evaporating N-electrodes and an ultraviolet-reflective metal layer in the first N-electrode region and the second N-electrode region; and
   (6) evaporating a P-electrode, wherein the passivation layer between the N-electrode and the P-electrode is used as a current isolation layer.

2. The method for improving TM mode light extraction efficiency of an ultraviolet AlInGaN light-emitting diode according to claim 1, wherein an Al content of the AlInGaN quantum well layer is lower than Al contents of the undoped AlInGaN layer, the N-type doped AlInGaN layer, and the AlInGaN electron barrier layer.

3. The method for improving TM mode light extraction efficiency of an ultraviolet AlInGaN light-emitting diode according to claim 1, wherein a first N-electrode at an edge and a second N-electrode at a centre of the chip are regular rectangular strip-shaped, corrugated or serrated; and
   one or more second N-electrodes are provided.

4. The method for improving TM mode light extraction efficiency of an ultraviolet AlInGaN light-emitting diode according to claim 1, wherein the N-electrode is made of Ti, Au, Al, Ni, Cr, Pt or an alloy thereof, to form a good ohmic contact; and
   a thickness of the N-electrode is less than a height from an etching position of the electrode to the AlInGaN quantum well layer.

5. The method for improving TM mode light extraction efficiency of an ultraviolet AlInGaN light-emitting diode according to claim 1, wherein an etching depth of the N-electrode is greater than a total thickness of the AlInGaN quantum well layer, the AlInGaN electron barrier layer, and the P-type doped AlInGaN layer.

6. The method for improving TM mode light extraction efficiency of an ultraviolet AlInGaN light-emitting diode according to claim 1, wherein the N-electrode is etched deep down to a position at a depth of 200 to 100 nm in an N-type region; and
   the first N-electrode region and the second N-electrode region each have a width of 1 to 100 μm.

7. The method for improving TM mode light extraction efficiency of an ultraviolet AlInGaN light-emitting diode according to claim 6, wherein a height of an upper surface of the N-electrode is less than a height of an upper surface of the AlInGaN quantum well layer.

8. The method for improving TM mode light extraction efficiency of an ultraviolet AlInGaN light-emitting diode according to claim 1, wherein the passivation layer is made of $SiO_2$, SixN or LiF; and
   a thickness of the passivation layer is greater than or equal to an etching depth at edge and central positions of an upper surface of the epitaxial structure.

9. The method for improving TM mode light extraction efficiency of an ultraviolet AlInGaN light-emitting diode according to claim 1, wherein based on an aspect ratio of etching, the passivation layer is etched to be a reflective layer evaporation region in a shape of an inverted trapezoid; and
   an inverted-trapezoidal angle of the inverted trapezoid is adjustable, and the passivation layer reserved between the inverted-trapezoidal reflective layer evaporation region to the sidewall of the chip has a minimum width of 200 nm to 50 μm, to form a desirable current isolation region.

10. The method for improving TM mode light extraction efficiency of an ultraviolet AlInGaN light-emitting diode according to claim 1, wherein the ultraviolet-reflective metal layer is made of Al, Pt, Mg, Rh or a compound thereof.

11. The method for improving TM mode light extraction efficiency of an ultraviolet AlInGaN light-emitting diode according to claim 1, wherein a thickness of the ultraviolet-reflective metal layer exceeds that of the AlInGaN quantum well layer, all ultraviolet light generated in the AlInGaN quantum well layer can be reflected to a surface of the substrate through an inverted-trapezoidal metal reflective layer to be extracted.

12. The method for improving TM mode light extraction efficiency of an ultraviolet AlInGaN light-emitting diode according to claim 10, wherein a thickness of the ultraviolet-reflective metal layer exceeds that of the AlInGaN quantum well layer, all ultraviolet light generated in the AlInGaN quantum well layer can be reflected to a surface of the substrate through an inverted-trapezoidal metal reflective layer to be extracted.

13. The method for improving TM mode light extraction efficiency of an ultraviolet AlInGaN light-emitting diode according to claim 1, wherein an ohmic contact layer of the P-electrode is made of Ti, Au, Al, Ni, Cr, Pt or an alloy thereof, and has a thickness less than 20 nm; and the ohmic contact layer of the P-electrode is then thickened by using Al, Pt, Mg, Rh or an alloy thereof, to reach a thickness of 50 to 1000 nm.

14. The method for improving TM mode light extraction efficiency of an ultraviolet AlInGaN light-emitting diode according to claim 1, wherein the substrate is made of a material with a high energy gap.

15. The method for improving TM mode light extraction efficiency of an ultraviolet AlInGaN light-emitting diode according to claim 1, wherein the substrate is removed.

16. The method for improving TM mode light extraction efficiency of an ultraviolet AlInGaN light-emitting diode according to claim 1, further comprising step (7) of:

manufacturing a flip chip, wherein the N-electrode is electrically connected to an alloy point through a metal ultraviolet reflective layer, so as to be electrically connected to a base;

the P-electrode is electrically connected to the base through the alloy point, and TM mode ultraviolet light is extracted desirably through a surface of the substrate.

17. A flip chip obtained using the method according to claim 16, comprising a base and a flipped ultraviolet AlInGaN light-emitting diode, wherein the ultraviolet AlInGaN light-emitting diode comprises a substrate material, an undoped AlInGaN layer, an N-type AlInGaN layer, an AlInGaN quantum well layer, an AlInGaN electron barrier layer, and a P-type AlInGaN contact layer stacked in sequence;

the ultraviolet AlInGaN light-emitting diode further comprises a first N-electrode region at an edge and a second N-electrode region at a centre;

the second N-electrode region comprises a second N-electrode region passivation layer at a centre and a first inverted trapezoidal structure located in the second N-electrode region passivation layer; and the first inverted trapezoidal structure comprises a second N-electrode at a centre and a second ultraviolet-reflective metal layer at a centre arranged in sequence;

the first N-electrode region comprises a first N-electrode region passivation layer at an edge and a second inverted trapezoidal structure located in the first edge-N-electrode region passivation layer; and the second inverted trapezoidal structure comprises a first N-electrode at an edge and a first ultraviolet-reflective metal layer at an edge arranged in sequence; and the base and the flipped ultraviolet AlInGaN light-emitting diode are connected through an alloy point.

18. The flip chip obtained using the method according to claim 17, wherein a P-electrode and the second ultraviolet-reflective metal layer in the flipped ultraviolet AlInGaN light-emitting diode are electrically connected to the base through alloy points respectively.

* * * * *